United States Patent
Dworski et al.

(10) Patent No.: US 7,391,349 B2
(45) Date of Patent: Jun. 24, 2008

(54) TEST APPARATUS AND METHOD FOR TESTING ANALOG/DIGITAL CONVERTERS

(75) Inventors: Claus Dworski, Villach (AT); Heinz Mattes, Munich (DE); Sebastian Sattler, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/692,554

(22) Filed: Mar. 28, 2007

(65) Prior Publication Data
US 2007/0216555 A1    Sep. 20, 2007

Related U.S. Application Data

(63) Continuation of application No. PCT/DE2005/001673, filed on Sep. 22, 2005.

(30) Foreign Application Priority Data
Sep. 28, 2004  (DE) .................. 10 2004 047 511

(51) Int. Cl.
 *H03M 1/10* (2006.01)
(52) U.S. Cl. .................. 341/120; 341/155
(58) Field of Classification Search .......... 341/120, 341/155, 61, 166; 455/423
See application file for complete search history.

(56) References Cited

U.S. PATENT DOCUMENTS

| | | | | |
|---|---|---|---|---|
| 5,063,383 A * | 11/1991 | Bobba | ................ | 341/120 |
| 5,175,547 A * | 12/1992 | Lyon et al. | ................ | 341/120 |
| 5,589,763 A * | 12/1996 | Burns | ................ | 324/76.15 |
| 6,944,569 B2 * | 9/2005 | Harbord et al. | ............ | 702/124 |
| 6,956,518 B1 * | 10/2005 | Piasecki et al. | ............ | 341/166 |
| 7,071,852 B1 * | 7/2006 | Wegener | ................ | 341/61 |
| 2005/0070268 A1 * | 3/2005 | Hakkinen et al. | ........... | 455/423 |

* cited by examiner

*Primary Examiner*—Jean B Jeanglaude
(74) *Attorney, Agent, or Firm*—Banner & Witcoff, Ltd.

(57) ABSTRACT

A method for testing AD converters (10) may have the steps of a) producing a digital test signal, b) producing an analog test signal as input signal for the AD converter (10) from the digital test signal, c) producing a sinusoidal, digital reference signal whose frequency is equal to or an integer multiple of the frequency of the analog test signal, d) mixing the test response from the AD converter (10) with the sine and the cosine of the digital reference signal to form mixed signals, e) determining the DC components of the mixed signals, and f) determining at least one of the parameters including amplitude, power components and phase angle for a fundamental or harmonic of the test response from the DC components of the mixed signals.

20 Claims, 5 Drawing Sheets

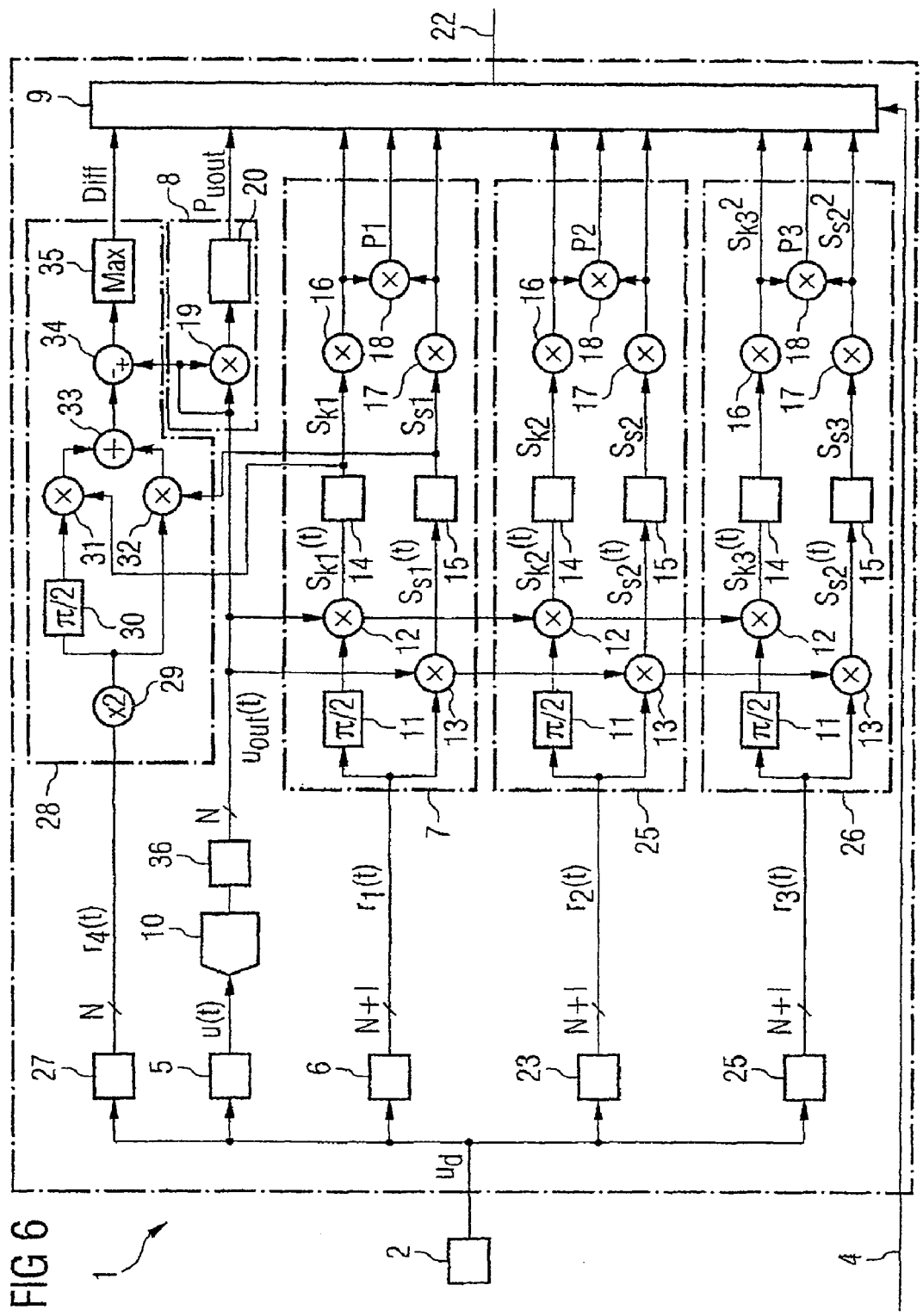

TEST APPARATUS AND METHOD FOR TESTING ANALOG/DIGITAL CONVERTERS

CROSS-REFERENCE TO RELATED APPLICATION

This application is a continuation of co-pending International Application No. PCT/DE2005/001673 filed Sep. 22, 2005, which designates the United States, and claims priority to German application number DE 10 2004 047 511.3 filed Sep. 28, 2004.

TECHNICAL FIELD

The invention relates to a test apparatus and a method for testing analog/digital converters.

BACKGROUND

To assess the quality of an analog/digital converter (AD converter), the values for SNR (signal to noise ratio), SINAD (signal plus noise plus distortion to noise plus distortion ratio), SNDR (signal to noise plus distortion ratio), and THD (total dynamic distortion) are usually ascertained. As the standard IEEE Std 1241-2000 describes, an AD converter is preferably analyzed by applying an analog signal and subsequently subjecting the test response to Fast Fourier Transformation (FFT). This involves calculating all the spectral components of the test response of the AD converter and from these the values for SNR, SINAD, SNDR and THD. FFT analysis is very computation intensive and results in long test times.

SUMMARY

A test apparatus for testing an analog/digital converter (AD converter), may comprise a memory which provides a digital test signal at its output, a digital/analog converter (DA converter) which converts the digital test signal into a sinusoidal analog test signal of frequency $\omega_0$ which is fed to the AD converter to be tested, as a result of which the AD converter to be tested outputs an N-bit digital test response, a frequency converter which takes the digital test signal and produces a sinusoidal m-bit digital reference signal at the frequency $\Omega$, wherein $\Omega$ is equal to or an integer multiple of the frequency $\omega_0$, a frequency selector which contains a phase shifter, two digital multipliers and two digital filters, wherein the phase shifter shifts the digital reference signal through $\pi/2$, wherein both multipliers respectively have two input channels and an output channel, wherein their first input channel is respectively connected to the digital test response, and wherein the second input channel has the digital reference signal connected to it in the case of the first multiplier and has the output channel from the phase shifter connected to it in the case of the second multiplier, wherein the filters determine and output the DC components of the output signals from the multipliers, an evaluation/control unit which receives output signals from the frequency selector.

BRIEF DESCRIPTION OF THE DRAWINGS

The invention is illustrated in more detail in the drawings using exemplary embodiments.

FIG. 6 shows a test apparatus for an AD converter as shown in FIG. 5 which has been extended by an additional circuit for analysis in the time domain.

DETAILED DESCRIPTION

The test apparatus, according to an embodiment, for testing an analog/digital converter (AD converter) contains, for example, a memory located in a tester. The memory contains the information which is in the form of the digital representation of the test signal. The output of the memory provides a digital test signal. The test apparatus also contains a digital/analog converter (DA converter). This converts the digital test signal into an analog test signal. The analog test signal is sinusoidal and has the frequency $\omega_0$.

$$u(t) = A_0 \cos(\omega_0 t)$$

The AD converter which is to be tested is fed this analog test signal and outputs a digital test response. This is described by the function $u_{out}(t)$.

$$u_{out}(t) = kA_0\cos(\omega_0 t) + \varphi_0) + \sum_{m=2}^{M} A_m \cos(m\omega_0 t + \varphi_m) + \varepsilon(t) + u_{offset}$$

If the converter were ideal, the test response would differ from the test signal only by the quantization error $\epsilon(t)$ producing the quantization. This error is expressed by quantization noise distributed evenly over all frequencies. However, unavoidable inadequacies in the converter mean that harmonic interference arises in the frequency spectrum of the test response on $(\Sigma A_m \ldots)$ which is at integer multiples of the test signal. The amplitude of the test response may also differ from that of the test signal. In this case, the gain factor (k) is not equal to unity. Sometimes, the test response is also overlaid by a DC voltage called an offset voltage ($u_{offset}$). In addition, there is a phase shift ($\phi_0$) between the test signal and the test response.

Figure 1:
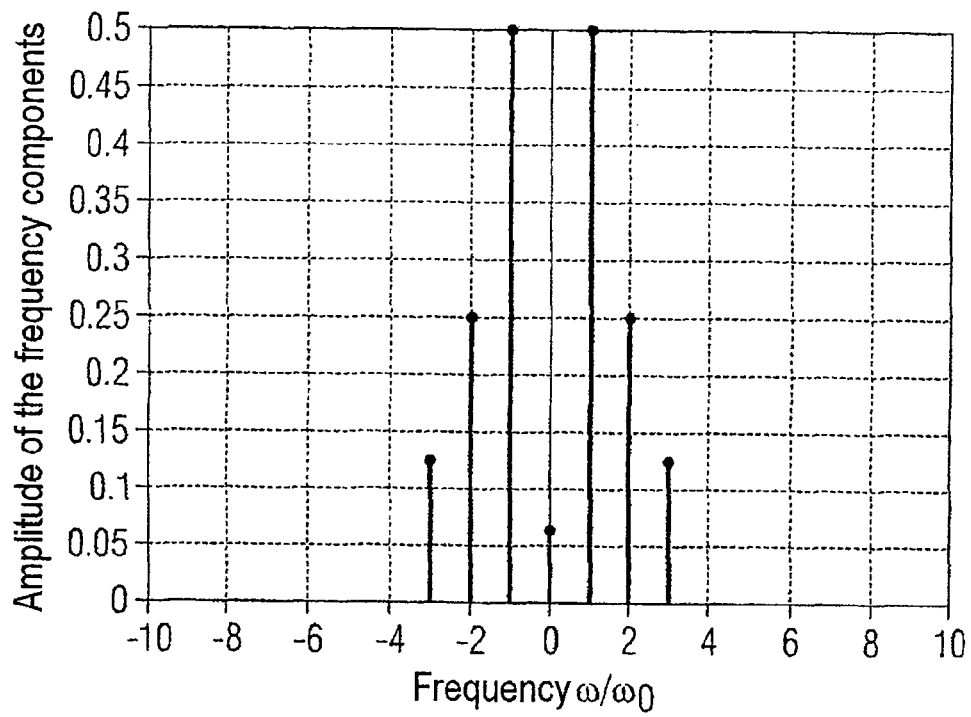
FIG. 1 shows the frequency spectrum of a test response for an analog/digital converter.

FIG. 1 shows the symmetrical base spectrum of such a signal mix. The line at the normalized frequency $\omega/\omega_0=0$ represents the amplitude of the offset voltage. The two lines at the normalized frequencies +1 and −1 correspond to the fundamental $\omega_0$ in the formula. The spectral lines at +2, −2, +3 and −3 correspond to the harmonics at twice and three times the fundamental. The spectral lines of the higher-order harmonics are not shown in FIG. 1 for the sake of clarity. The quantization noise is indicated by the wide vertical line above the abscissa.

For the test, according to an embodiment, the test response $u_{out}(t)$ is multiplied once by a sinusoidal reference signal of amplitude 1 and angular frequency $\Omega$ and once by a cosinusoidal reference signal of amplitude 1 and angular frequency $\Omega$. The test response $u_{out}(t)$ is N bits long as a digital signal, and therefore has an amplitude resolution of N. In other areas of the art, this mixing principle is also known as homodyne mixing.

For this, the test apparatus contains a frequency converter which takes the digital test signal and produces a sinusoidal digital reference signal at the frequency $\Omega$, according to an embodiment. In this case, $\Omega$ is an integer multiple of the frequency $\omega_0$. The digital reference signal is m bits long and its amplitude resolution is therefore m, wherein m is a positive integer.

The test apparatus, according to an embodiment, also contains a frequency selector with a phase shifter, with two digital multipliers and with two digital filters. The phase shifter shifts the digital reference signal through $\pi/2$, and hence takes a sinusoidal signal and makes a cosinusoidal signal at the same frequency. The multipliers respectively have two input channels. In this connection, one channel denotes a plurality of lines on which the digital representation of a signal is jointly depicted. The number of lines corresponds to the width of the channel. The multipliers multiply the signal which is present on their first input channels by the signal which is present on the second input channel. In this connection, the term input is also used for input channel and the term output channel is used for the output channel. The first input channel of the first multiplier is connected to the digital test response and the second input channel of the first multiplier is connected to the digital reference signal. The first input channel of the second multiplier is connected to the digital test response and the second input channel of the second multiplier is connected to the output signal from the phase shifter.

This results in the two signals $S_K(t)$ and $S_S(t)$, which are made up of sums of mix products.

$$S_S(t) = kA_0 \sin(\Omega t)\cos(\omega_0 t + \varphi_0) +$$
$$\sum_{n=2} A_n \sin(\Omega t)\cos(n\omega_0 t + \varphi_n) + \sin(\Omega t)(\varepsilon(t) + u_{offset})$$

$$S_K(t) = kA_0 \cos(\Omega t)\cos(\omega_0 t + \varphi_0) +$$
$$\sum_{n=2} A_n \cos(\Omega t)\cos(n\omega_0 t + \varphi_n) + \cos(\Omega t)(\varepsilon(t) + u_{offset})$$

The products of the harmonic functions can be reshaped using the addition theorems to form sums.

$$S_S(t) = \frac{kA_0}{2}\sin((\Omega - \omega_0)t - \varphi_0) + \frac{kA_0}{2}\sin((\Omega - \omega_0)t - \varphi_0) +$$
$$\frac{1}{2}\sum_{m=2}^{M} A_m \sin((\Omega - m\omega_0)t - \varphi_m) + \frac{1}{2}\sum_{m=2}^{M} A_m \sin((\Omega - m\omega_0)t - \varphi_m) +$$
$$\sin(\Omega t)(\varepsilon(t) + u_{offset})$$

$$S_K(t) = \frac{kA_0}{2}\cos((\Omega - \omega_0)t - \varphi_0) + \frac{kA_0}{2}\cos((\Omega - \omega_0)t - \varphi_0) +$$
$$\frac{1}{2}\sum_{m}^{M} A_m \cos((\Omega - m\omega_0)t - \varphi_m) + \frac{1}{2}\sum_{m}^{M} A_m \cos((\Omega - m\omega_0)t - \varphi_m) +$$
$$\cos(\Omega t)(\varepsilon(t) + u_{offset})$$

Figure 2:
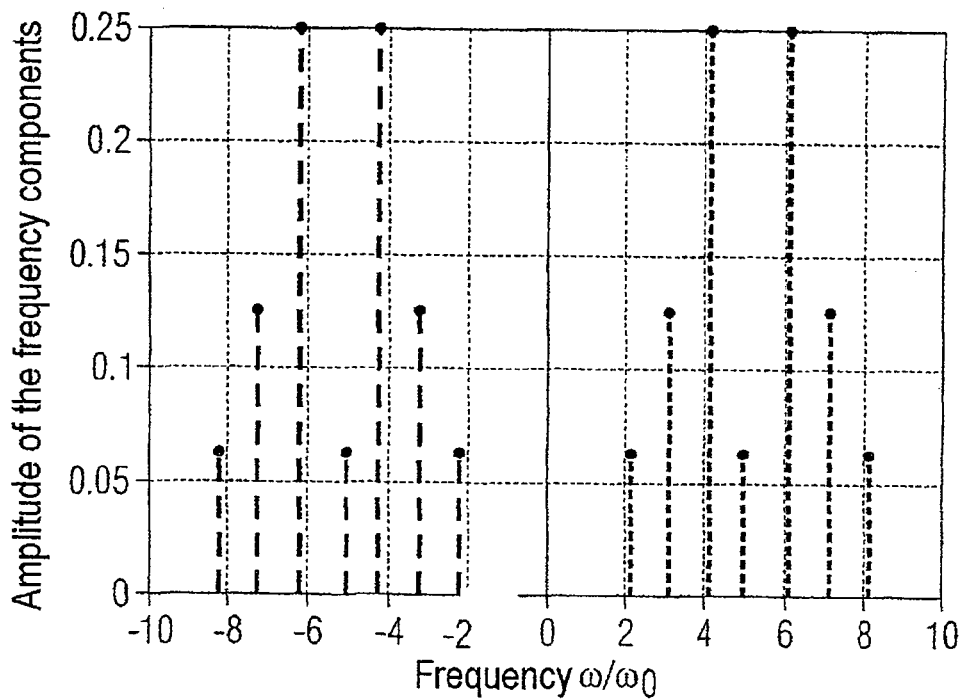
FIG. 2 shows a frequency spectrum which is obtained when the test response of an AD converter is mixed with a reference signal.

The frequency spectrum for these sums is shown by way of example in FIG. 2. The frequency spectra for the test response are shifted from their original position, which can be seen in FIG. 1, as a result of the mixing with the reference signal and come to rest to the right and left of the frequency of the reference signal. In FIG. 2, the angular frequency of the reference signal $\Omega$ is five times as great as the angular frequency of the analog test signal $\omega_0$. The spectrum is therefore arranged around the angular frequencies $+5\omega_0$ and $-5\omega_0$.

If the bandwidth of the signal is less than the mix frequency, the two spectra for the right-hand and left-hand sidebands are separated from one another. In FIG. 2, the normalized bandwidth is equal to three and the normalized mix frequency of the reference signal is equal to five. There is therefore no overlap between the sidebands.

If the normalized mix frequency of the reference signal is less than the bandwidth of the signal, on the other hand, the right-hand and left-hand sidebands overlap and a signal component is produced at the normalized frequency 0.

Figure 3:
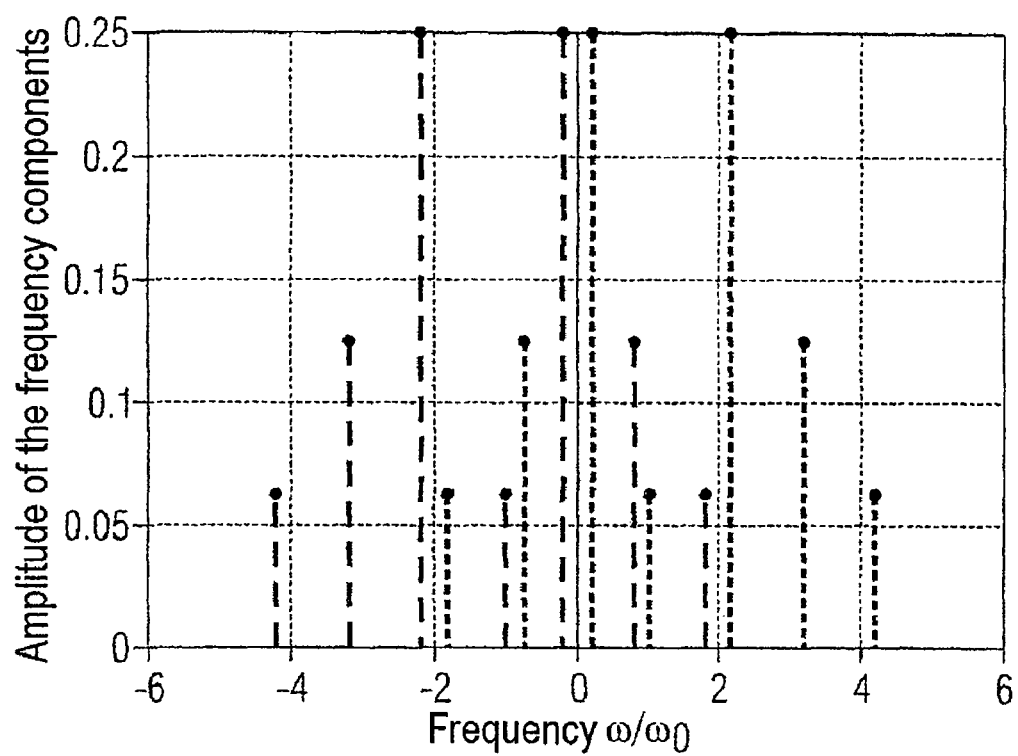
FIG. 3 shows a frequency spectrum as in FIG. 2 for an altered frequency of the reference signal.

FIG. 3 shows the frequency spectrum obtained from mixing the digital test response with a mix frequency which corresponds to the frequency of the analog test signal. The dashed lines belong to the left-hand sideband and the dotted lines belong to the right-hand sideband. Thus, the third harmonic is revealed after mixing at $\omega/\omega_0 = \pm 4$. Other spectra are made up of a plurality of components. Thus, the spectrum at $\omega/\omega_0 = \pm 2$ contains components of the fundamental (large amplitude) and of the third harmonic (small amplitude).

In FIG. 3, the mix frequency is chosen, in comparison with FIG. 2, such that at the normalized frequency zero there appear frequency components from the right-hand and left-hand sidebands. In general, only mix frequencies at which only one frequency component of the right-hand sideband and only one frequency component of the left-hand sideband appear at the zero point are used for the test apparatus according to an embodiment. In FIG. 3, the component at the frequency zero is precisely the component of the fundamental signal which has the same frequency as the reference signal.

Specific setting of the frequency of the reference signal therefore allows any frequency component at a particular point in a frequency spectrum to be shifted. It is therefore possible to separate a particular frequency component from the rest of the signal and to analyze it separately.

The frequency of the reference signal is chosen such that the spectral line to be examined in the test response is shifted to the frequency zero point and thus appears as a transformed offset voltage.

If $\Omega = \omega_0$ is chosen as in FIG. 3 then the spectral line of the test signal's fundamental is shifted firstly to the zero point on the frequency axis and secondly to twice its frequency $\omega/\omega_0 = \pm 2$.

$$S_S(t)/_{\Omega=\omega_0} = \frac{kA_0}{2}\sin(-\varphi_0) + \frac{kA_0}{2}\sin(2\omega_0 t + \varphi_0) +$$
$$\frac{1}{2}\sum_{m=2}^{M} A_m \sin((\omega_0 - m\omega_0)t - \varphi_m) + \frac{1}{2}\sum_{m=2}^{M} A_m \sin((\omega_0 + m\omega_0)t + \varphi_m) +$$
$$\sin(\omega_0 t)(\varepsilon(t) + u_{offset})$$

$$S_K(t)/_{\Omega=\omega_0} = \frac{kA_0}{2}\cos(-\varphi_0) + \frac{kA_0}{2}\cos(2\omega_0 t + \varphi_0) +$$
$$\frac{1}{2}\sum_{m=2}^{M} A_m \cos((\omega_0 - m\omega_0)t - \varphi_m) + \frac{1}{2}\sum_{m=2}^{M} A_m \cos((\omega_0 + m\omega_0)t + \varphi_m) +$$
$$\cos(\omega_0 t)(\varepsilon(t) + u_{offset})$$

The signals $S_S(t)$ and $S_K(t)$ are both made up of a DC component and a sum comprising AC components. The DC component is the first summand in the above formula.

To determine the DC component, according to an embodiment, the frequency selector contains digital filters. The inputs of the filters are connected to the outputs of the multipliers, and their output respectively outputs the DC component of their input signals. These filters may be low pass filters whose cutoff frequency is chosen to be sufficiently low and whose edge gradient is chosen to be sufficiently large. Suitable filters are also circuits which integrate or sum the input signals and ascertain the average of the integration or summation. Since the integral gives the value zero over an entire period of a harmonic signal, the AC components cancel one another out. Only the DC component is left.

Accordingly, the two values $S_S$ and $S_K$ are available.

$$S_S = \frac{kA_0}{2}\sin(-\varphi_0)$$

$$S_S = \frac{kA_0}{2}\cos(-\varphi_0)$$

Both expressions also contain the unknown phase angle $\varphi_0$ between the fundamental of the digital test response from the analog/digital converter and the reference signal.

To determine the amplitude of the fundamental of the test signal from $S_S$ and $S_K$, there are two options. The first option involves ascertaining the phase angle $\varphi_0$. This can be done, according to an embodiment, using the following computation steps, for example.

$$\frac{S_S}{S_K} = \frac{\sin(-\varphi_0)}{\cos(-\varphi_0)} = \tan(-\varphi_0)$$

$$\Rightarrow \varphi_0 = -\arctan\left(\frac{S_S}{S_K}\right)$$

The test apparatus also contains an evaluation/control unit which receives the output signals from the frequency selector. This evaluation/control unit can receive the signals $S_S$ and $S_K$ and calculate the phase shift $\varphi_0$ from them, for example.

The second option allows the sum of squares of $S_S$ and $S_K$ to be formed.

$$S_S^2 + S_K^2 = \frac{k^2 A_0^2}{4}\sin^2(-\varphi_0) + \frac{k^2 A_0^2}{4}\cos^2(-\varphi_0) = \frac{k^2 A_0^2}{4}$$

$$kA_0 = 2*\sqrt{S_S^2 + S_K^2}$$

Preferably, the frequency selector in the test apparatus contains two squaring elements which multiply the output signals from the filters by themselves. The output signals from the two squaring elements are added by an adder. This forms the sum of squares for the signals $S_S$ and $S_K$. The evaluation/control unit can calculate the value for $kA_0$ from this sum of squares.

Hence, the amplitude of the fundamental of the test response has been determined. If the integer multiples of the frequency $\omega_0$ and also the frequency $0$ are now inserted into the formula $S_S(t)$ for $\Omega$, the following information is available:

$u_{offset}$: the offset voltage of the test response $kA_0$: the amplitude of the fundamental of the test response $P_0$: the power component of the fundamental of the test response $\varphi_0$: the phase angle of the fundamental of the test response, taking the reference signal as a reference $A_i$: the amplitude of the i-th harmonic of the test response $P_i$: the power component of the i-th harmonic of the test response $\varphi_i$: the phase angle of the i-th harmonic of the test response, taking the reference signal as a reference.

If the frequency converter is set by a frequency guidance channel such that it changes the frequency, the frequencies $2\omega_0$ and $3\omega_0$ can be successively output as reference signals. Thus, the amplitudes, the power components and the phase angles of the second and third harmonics of the test response are also calculated. If the amplitude and/or the phase of its output signal is/are altered by the frequency guidance channel, the output signal can be adapted to the properties of the AD converter which is to be tested.

Advantageously, the test apparatus also contains a power measurement unit, according to an embodiment. This power measurement unit contains a squaring element which multiplies the digital test response by itself. The squaring element is a digital squaring element. An averaging element in the power measurement unit forms the average from this multiplication and sends the result to the evaluation/control unit. Its output outputs the result of this averaging. This result is the total power of the test response. The squaring element and the averaging element are digital, i.e. they process digital signals. From the values for $P_{uout}$, $U_{offset}$, $kA_0$, $P_0$, $\varphi_0$, $A_i$, $P_i$ and $\varphi_i$, it is possible to extract the characteristic power parameters for the AD converter SNR, SINAD, SNDR and THD in the evaluation/control unit.

In a further embodiment, the test apparatus contains a multiplicity of frequency converters and a multiplicity of frequency selectors. The frequency converters produce a multiplicity of digital reference signals which differ in terms of their frequency. At least two of the frequency selectors are connected to digital reference signals at different frequencies. The outputs of the frequency selectors are connected to the evaluation/control unit. It is therefore possible to measure the amplitudes, the power components and the phase angles of a plurality of harmonics or of the fundamental and at least one harmonic simultaneously. This results in a saving on test time. Another possibility with this parallel connection of frequency converters and frequency selectors is that the frequency converters can have their frequency altered by the evaluation/control unit.

The test apparatus can be extended, according to an embodiment, such that an offset compensation section is connected to the output of the AD converter which is to be tested. As a result, the component $U_{offset}$ of the test response $U_{out}(t)$ is zero and does not need to be ascertained by the test apparatus.

Providing an additional measurement circuit, according to an embodiment, allows the maximum discrepancy between the test response of the analog/digital converter and the test response of an ideal analog/digital converter to be measured. The additional measurement circuit contains a digital first multiplication element whose input has a further digital reference signal connected to it which is produced by a further frequency converter. This further digital reference signal has the same frequency as the analog test signal and the same amplitude resolution as the output signal from the AD converter which is to be tested. The first multiplication element multiplies the further digital reference signal by the factor 2. A phase shifter which the additional measurement circuit contains shifts the phase of the output signal from the first multiplication element through $\pi/2$. A digital second multiplication element multiplies the output signal from the first multiplication element by the output signal from the first multiplier in the frequency selector. The digital third multiplication element multiplies the output signal from the phase shifter in the additional measurement circuit by the output signal from the second multiplier in the frequency selector. The additional measurement circuit contains an adder which is used to form the sum from the second and third multiplication elements. A subtraction element subtracts the test signal from the output signal from the adder. A maximum value ascertainment element ascertains the maximum value of the output signal from the subtraction element and outputs it. An ideal test response for an analog/digital converter contains only frequency components of the input signal.

$$u_{out,ideal} = kA_0 \cos(\omega_0 t + \phi_0)$$

According to the additional theorem, the following is obtained:

$$u_{out,ideal} = kA_0(\cos(\phi_0)\cos(\omega_0 t) - \sin(\phi_0)\sin(\omega_0 t))$$

The amplitudes now correspond precisely to half the values of $S_S$ and $S_K$, so that the following can also be written:

$$u_{out,ideal} = 2(S_K \cos(\omega_0 t) + S_S \sin(\omega_0 t))$$

In the additional measurement circuit, according to an embodiment, the test response of the ideal analog/digital converter is ascertained on the basis of the above formula. The output signal from the adder gives the test response for an ideal AD converter. This is deducted from the test response of the analog/digital converter which is to be tested, and then the maximum value is formed for this subtraction. As a result, the maximum discrepancy between the test response of the analog/digital converter and the test response of an ideal analog/digital converter has been measured.

The amplitude resolution of the further reference signal, which is fed to the additional measurement circuit, is always the same as the amplitude resolution of the AD converter which is to be tested. By contrast, the amplitude resolution m of the digital reference signal which is fed to a frequency selector is preferably greater than the amplitude resolution N of the digital test response. This reduces the quantization error produced by the reference signal. The greater the difference between m and N in this context, the less this quantization error corrupts the measurement result.

The memory of the test apparatus is usually found in a tester, while the other circuits of the test apparatus are located on a loadboard. However, it is also possible for parts of the test apparatus such as the frequency converter, the frequency selectors, the power measurement unit and the additional measurement unit to be integrated fully or in part in the analog/digital converter which is to be tested.

Particularly if the AD converter is a module of a mixed signal chip, the circuits can be integrated partly or fully on the mixed signal chip as a "Built In Self Test unit," according to an embodiment. Modules which are already present on the mixed signal chip, such as a microcontroller, adder, multiplier and memory, for example, can be reconfigured for testing the AD converter. In this case, the components on the loadboard are reduced to the DA converter. The test is controlled by an internal microcontroller.

Future products with increased safety requirements can therefore perform self-test cycles during regular operation, according to an embodiment. Thus, when starting a motor vehicle, for example, the electronics for safety-related functions such as ABS or airbags would automatically be checked. This requires the semiconductor chips to have self-test capability. The embodiments are suitable for self-test implementation in the chip on account of its low demands on additional electronic circuits.

The test apparatus may also be partly integrated in FPGA (Field Programmable Gate Array) chips, according to an embodiment. Such chips are inexpensive and necessary changes can be implemented quickly using the FPGA.

Parts of the test apparatus can also be integrated in an external tester, according to an embodiment. In the most extreme case, the loadboard now just comprises the base into which the chip to be tested is plugged.

In a method, according to an embodiment, for testing AD converters, a tester is first of all provided which is connected to a loadboard. This loadboard contains at least one test base for testing integrated circuits. The loadboard is fitted with the AD converter to be tested. A digital test signal is produced from which, in turn, an analog test signal is generated. This analog test signal is applied to an AD converter as input signal. In addition, a digital reference signal is produced from the digital test signal. This signal is sinusoidal and has the same frequency as the analog test signal or has a frequency which is an integer multiple of the frequency of the analog test signal. The test response is mixed firstly with the sine of the digital reference signal and secondly with the cosine of the digital reference signal to form mixed signals. For these mixed signals produced by mixing, the DC components are determined. From the DC components of the mixed signals, one of the parameters comprising amplitude, power component or phase angle is determined for a fundamental or harmonic of the test response. This method can be used to determine said parameters without performing a complex FFT (Fast Fourier Transformation). The latter first of all requires data transfer from the tester's data holder to a processor and complex computation. Initial estimates show that the method according to an embodiment can be used to reduce the test time by a factor of 4.

The phase angle can be ascertained by calculating the arc tangent of the quotient of the DC components of the mix. The DC components are already available from the calculation of the amplitude and are reused for calculating the phase angle.

If the method is extended, according to an embodiment, such that the phase angle of the fundamental of the test response is determined by means of a shift in the phase of the digital reference signal, this avoids the need for an arc tangent to be ascertained in order to calculate the phase angle, which is relatively complex. Instead, the reference signal has its phase shifted until a maximum occurs at $S_S$ and a minimum occurs at $S_K$ or a minimum occurs at $S_S$ and a maximum occurs at $S_K$.

If a plurality of digital reference signals with differing frequencies are produced instead of just one digital reference signal and these digital reference signals are simultaneously mixed with the test response, according to an embodiment, parameters for different harmonics or for fundamentals and harmonics can be ascertained at the same time. This parallelization saves test time and complexity for controlling the method.

When the parameters amplitude, power component and phase angle have been measured for a fundamental or harmonic of the test response, according to an embodiment, the frequency of the digital reference signal can be altered and the steps of mixing the test response, determining the DC components and determining the parameters can be repeated again. This means that parameters are ascertained for a different fundamental or harmonic than in the case of the first test pass. One advantage in this context is that only a few circuits need to be available in order to produce the digital reference signal.

If the method, according to an embodiment, additionally contains a step of determining the total power for the test response, the same method can be used not only to determine the parameters for the fundamentals and harmonics but also to consider them in relation to the total power.

Following ascertainment of the parameters amplitude, phase angle, power component of the fundamentals and harmonics and of the total power of the test response, the method, according to an embodiment, may contain a further step in which the values SNR, SINAD, SNDR and THD of the AD converter are ascertained. The parameters which characterize the quality of an AD converter are therefore available in their entirety.

It is advantageous if the test response undergoes compensation, according to an embodiment, for its offset before being mixed with other signals. This means that the offset does not need to be taken into account when calculating the other parameters. To compensate for an offset in a signal, the average of the signal is formed and stored repeatedly, for example. The average of these stored averages is then formed, stored and deducted from the signal.

To calculate the maximum discrepancy between the test response of the analog/digital converter and a test response of an ideal analog/digital converter, a method which involves compensating for the offset in the test response contains additional steps, according to an embodiment. A reference signal at the same frequency as the analog test signal is multiplied by two. The DC components of the mixed signals are mixed with the cosine or with the sine of this reference signal multiplied by two. The result of these multiplications is added and then deducted from the test response. The maximum value of this subtraction is ascertained and gives the maximum discrepancy between the test response of the analog/digital converter and the test response of an ideal analog/digital converter.

The exemplary embodiment is described below by assuming a case which arises from FIGS. 1 to 3, which have already been described above. These are not described again here for the sake of simplicity.

Figure 4:
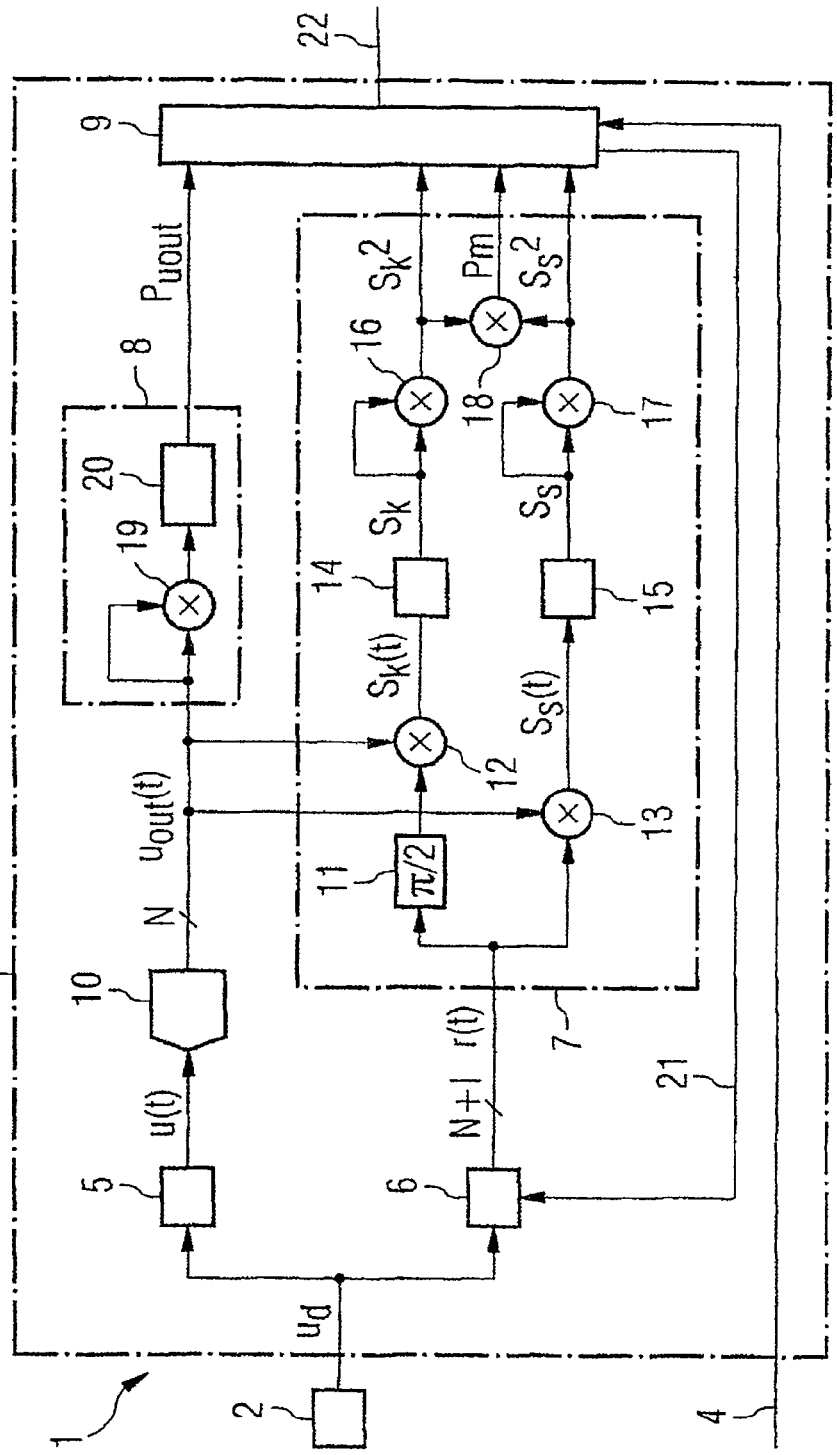
FIG. 4 shows into a test apparatus according to an embodiment for analyzing an AD converter.

FIG. 4 shows a first embodiment of a test apparatus 1 according to an embodiment. It contains a memory 2, a loadboard 3 and a control channel 4. The memory 2 is part of a tester (not shown in the figure) and the control channel 4 is driven by the tester.

The loadboard 3 contains a DA converter 5, a frequency converter 6, a frequency selector 7, a power measurement unit 8 and an evaluation/control unit 9. In addition, the AD converter 10 to be tested is connected on the loadboard. The frequency selector 7 contains a phase shifter 11, a digital first multiplier 12, a digital second multiplier 13, a digital first filter 14, a digital second filter 15, two squaring elements 16 and 17 and an adder 18.

The power measurement unit 8 contains a squaring element 19 and an averaging element 20.

The output of the memory 2 is connected to the input of the DA converter 5 and to the input of the frequency selector 6 via the channel $u_d$. As a digital input, the input of the frequency selector 6 has a particular width n, wherein n is an integer. The input of the frequency selector 6 is therefore an input channel. For the components which follow too, the terms input and output are used for a digital input channel and a digital output channel, respectively. The output of the DA converter 5 is connected to the AD converter 10 by means of the analog signal u(t). The output channel of the AD converter 10 is connected to the input channel of the digital squaring element 19 in the power measurement unit 8 and to a first input channel of the first multiplier 12 and to a first input channel of the second multiplier 13 in the frequency selector 7 by means of the digital test response $u_{out}(t)$. The digital output channel $u_{out}(t)$ comprises N lines. The output of the digital squaring element 19 in the power measurement unit 8 is connected to the averaging element 20 in the power measurement unit 8. The output of the averaging element 20 is connected to one input of the evaluation/control unit 9 via the line $P_{uout}$.

The output of the frequency converter 6 is connected to the phase shifter 11 and to the second input channel of the second multiplier 13 in the frequency selector 7 via the channel r(t). The channel r(t) comprises N+l lines, wherein l is greater than zero.

The output of the phase shifter 11 is connected to the second input channel of the first multiplier 12 in the frequency selector 7. Within the frequency selector 7, the input of the first filter 14 is connected to the output of the first multiplier 12 via the channel $S_K(t)$, and the input channel of the second filter 15 is connected to the output of the second multiplier 13 via the channel $S_S(t)$. The output of the first filter 14 is connected to the inputs of the first squaring element 16 via the line $S_K$, and the output of the second filter 15 is connected to the inputs of the squaring element 17 via the line $S_S$. The output of the first squaring element 16 is connected both to one input of the adder 18 and to one input of the evaluation/control unit 9 via the line $S_K^2$. The output of the second squaring element 17 is connected firstly to one input of the adder 18 and also to one input of the evaluation/control unit 9 via the line $S_S^2$. The output of the adder is connected to the evaluation/control unit 9 via the line $P_n$. An output of the evaluation/control unit 9 is connected to one input of the frequency converter 6 via the frequency setting channel 21. One input of the evaluation/control circuit 9 is connected to the control channel 4. The evaluation/control unit has an output channel 22 which can be connected to the tester.

The memory 2 provides the digital test signal $u_d$. From this, the analog test signal u(t) and the reference signal r(t) are produced. The output of the AD converter 10 produces the digital test response $u_{out}(t)$. As a digital signal, the digital test response $u_{out}(t)$ has a resolution of N bits. The digital reference signal r(t) has a higher resolution than the test response and is therefore N+l bits long, wherein l is an integer which is greater than zero. The digital test response $u_{out}(t)$ is mixed with the reference signal r(t). The results of these mixes $S_K(t)$ and $S_S(t)$ are filtered for their DC component by means of the filters 14 and 15. The DC components $S_K$ and $S_S$ are squared by means of the squaring elements 16 and 17. The resultant signals $S_K^2$ and $S_S^2$ are provided for the evaluation/control unit. In addition, the sum of these two signals is produced by the adder 18 and is forwarded to the evaluation/control unit 9 as $P_m$.

The test response $u_{out}(t)$ is squared in the power measurement unit 8 by the squaring element 19. The result is averaged by means of the averaging element 20. The resultant power $P_{uout}$ is forwarded to the evaluation/control unit 9. The evaluation/control unit 9 can use the frequency setting channel 21 to set/influence the frequency of the frequency converter 6. This means that amplitudes, phase angles and power components can be calculated for the fundamental and various harmonics of the test response of the AD converter in the evaluation/control unit 9. The results of these calculations are output to the output channel 22.

In the evaluation/control unit, the phase angle $\phi_0$ for the fundamental can now be calculated on the basis of the input signals $S_K^2$ and $S_S^2$, for example. This phase angle indicates what phase difference there is between the test response and the reference signal. This can be calculated from the two input signals $S_K^2$ and $S_S^2$ using the computation rule stated above.

In another embodiment, the frequency setting channel 21 can also alter the phase and/or the amplitude of the digital reference signal. This means that the frequency setting channel, for example, could shift the phase of the reference signal r(t) until a minimum has been formed at $S_K^2$ or $S_S^2$ in order to ascertain the phase angle $\phi_0$. To this end, the evaluation/ control unit would need to be provided with an apparatus which can calculate a minimum.

Figure 5:
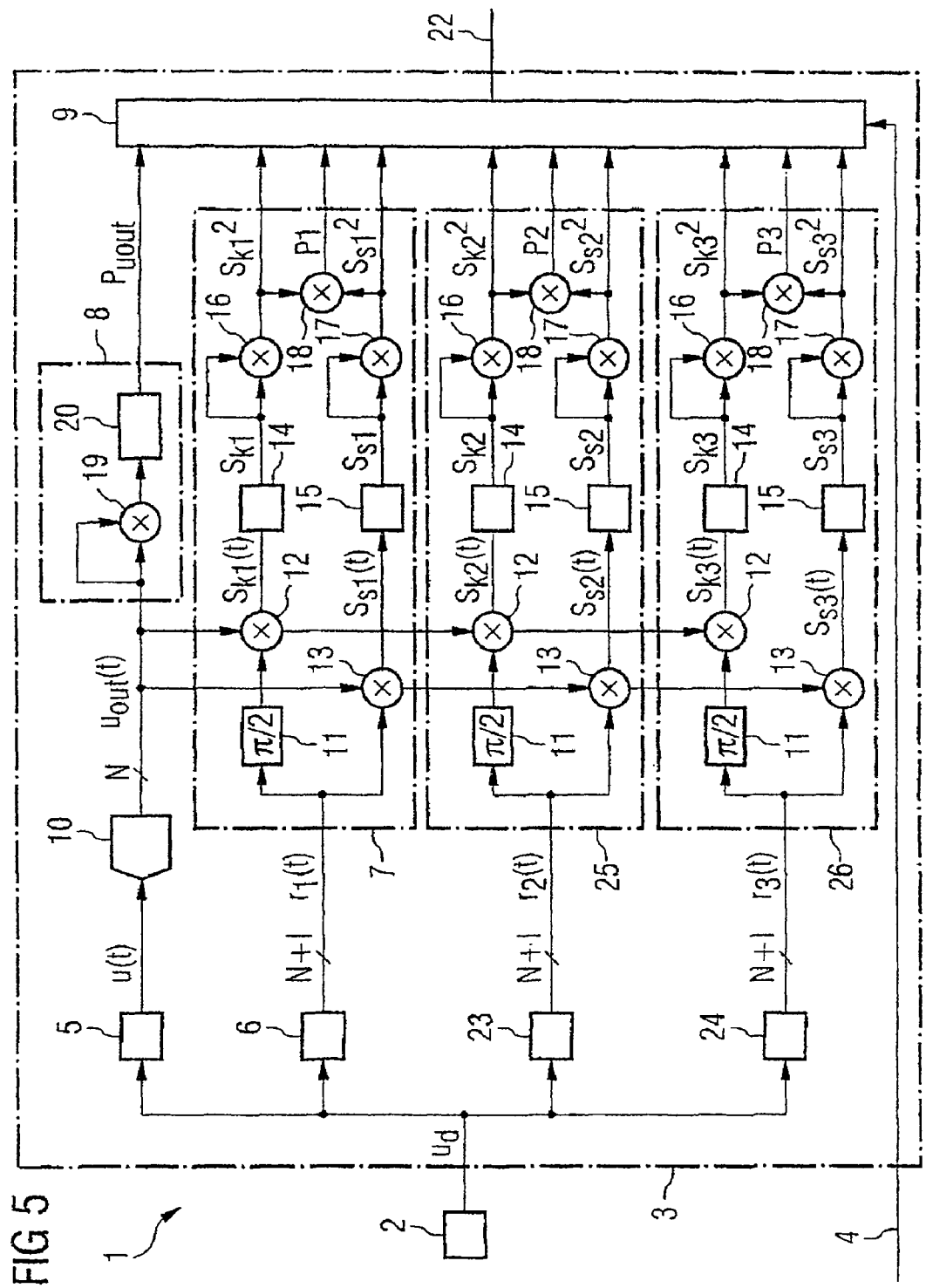
FIG. 5 shows another embodiment of a test apparatus for an AD converter which can be used to carry out three analyses in parallel.

FIG. 5 shows another embodiment of the test apparatus 1 according to an embodiment which shows an extension to the test apparatus 1 shown in FIG. 4. Components with the same functions as in the previous figures are identified by means of the same reference symbols and are not discussed separately. The output signal from the first frequency converter 6 has been labeled $r_1(t)$. The names of the lines within the first frequency selector 7 have also had the index 1 appended to them. Their connections and their operation correspond to the connections and operation in FIG. 4, however.

The test apparatus has been extended by virtue of the loadboard 3 accommodating a second frequency converter 23, a third frequency converter 24, a second frequency selector 25 and a third frequency selector 26.

The second frequency converter 23 and the third frequency converter 24 produce the second reference signal $r_2(t)$ and the third reference signal $r_3(t)$ from the digital representation of the test signal $u_d$. The second frequency selector 25 is supplied with the second reference signal $r_2(t)$ and the third frequency selector 26 is supplied with the third reference signal $r_3(t)$. The first input channels of the first multiplier 12 and of the second multiplier 13 in all the frequency selectors 7, 25, 26 are connected to the digital test response $u_{out}(t)$. The outputs of the frequency selectors 7, 25, 26 are connected to inputs of the evaluation/control unit 9. In contrast to FIG. 4, there is no frequency setting channel 21 from the evaluation/control unit to the frequency converters 6, 23 and 24.

The reference signals $r_1(t)$, $r_2(t)$ and $r_3(t)$ are sinusoidal signals which differ in terms of their frequency. The frequency of $r_1(t)$ is $\omega_0$, the frequency of $r_2(t)$ is $2\omega_0$, and the frequency of the third reference signal $r_3(t)$ is $3\omega_0$. The preset test structure 1 simultaneously determines the amplitudes, the power components and the phase angles of the fundamental and also of the second and third harmonics of the test response. The simultaneous measurements performed save test time.

FIG. 6 shows a test apparatus 1 which has been extended over the test apparatus in FIG. 5 by an offset compensation section 36, a fourth frequency converter 27 and an additional measurement circuit 28. The design and operation of the components already shown in FIG. 5 and their connections to one another are the same and are therefore not explained again.

Connected between the output of the AD converter 10 and the digital test response is an offset compensation section 36.

The fourth frequency converter 27 has its input connected to the digital representation of the test signal $u_d$. Its output connects it to the fourth reference signal $r_4(t)$.

The additional measurement circuit 28 contains a digital first multiplication element 29, a phase shifter 30, a digital second multiplication element 31, a digital third multiplication element 32, a digital adder 33, a digital subtraction element 34 and a maximum value ascertainment element 35. A multiplication element has the same function as a multiplier. The first multiplication element 29 has its input connected to the fourth reference signal $r_4(t)$ and has its output connected to the phase shifter 30 and to the first input of the third multiplication element 32. The output of the phase shifter 30 is connected to the first input of the second multiplication element 31. The second input of the second multiplication element 31 is connected to the output of the first filter 14 in the first frequency selector 7. The second input of the third multiplication element 32 is connected to the output of the second filter 15 in the first frequency selector 7. The outputs of the second multiplication element 31 and of the third multiplication element 32 are connected to the two inputs of the adder 33. The output of the adder 33 is connected to the negative input of the subtraction element 34. The positive input of the subtraction element 34 has the test response $u_{out}(t)$ connected to it. The output of the subtraction element 34 is connected to the input of the maximum value ascertainment element 35. The output of the maximum value ascertainment element 35 is connected to the evaluation/control unit 9 via the line Diff.

The offset compensation section brings about compensation for any offset in the output signal from the AD converter such that for the aforementioned test response $u_{out}(t)$ the summand $u_{offset}$ is zero.

The additional measurement circuit compares the test response $u_{out}(t)$ with an ideal test response by deducting them from one another. The ideal test response is produced from the DC components of the digital test response mixed with the first reference signal $r_1(t)$. Next, the maximum value of the difference between the ideal and digital test responses is ascertained. The additional measurement circuit can analyze the response of the AD converter in the time domain with relatively little complexity.

The invention is also implemented in the following compilation of features.

An integrated chip, particularly a mixed signal chip, on which a test apparatus according to an embodiment is monolithically integrated.

An integrated test circuit as above which is in the form of a Field Programmable Gate Array.

A needle card for testing integrated circuits or ICs, the needle card having an integrated test circuit as above and a digital/analog converter.

A needle card which has an test apparatus according to an embodiment.

A loadboard for holding a needle card for testing integrated circuits or ICs and/or having one or more test bases for testing integrated circuits or ICs, the loadboard (41, 51, 61) having an integrated test circuit (IC$_2$, IC$_4$) as above or a needle card as above.

A tester for producing digital signals which has an test apparatus according to an embodiment and/or a chip as above and/or a needle card as above and/or a loadboard as above.

A computer program for executing a method for testing an AD converter which is designed such that the inventive method steps can be carried out.

What is claimed is:

1. A test apparatus for testing an analog/digital converter (AD converter), comprising:
a memory which provides a digital test signal at its output,
a digital/analog converter (DA converter) which converts the digital test signal into a sinusoidal analog test signal of frequency $\omega_0$ which is fed to the AD converter to be tested, as a result of which the AD converter to be tested outputs an N-bit digital test response,
a frequency converter which takes the digital test signal and produces a sinusoidal m-bit digital reference signal at the frequency $\Omega$, wherein $\Omega$ is equal to or an integer multiple of the frequency $\omega_0$,
a frequency selector which contains a phase shifter, two digital multipliers and two digital filters,
wherein the phase shifter shifts the digital reference signal through $\pi/2$,
wherein both multipliers respectively have two input channels and an output channel, wherein their first input channel is respectively connected to the digital test response, and wherein the second input channel has the digital reference signal connected to it in the case of the first multiplier and has the output channel from the phase shifter connected to it in the case of the second multiplier, wherein the filters determine and output the DC components of the output signals from the multipliers, an evaluation/control unit which receives output signals from the frequency selector.

2. The test apparatus according to claim 1, wherein the frequency selector contains two squaring elements which multiply the signals at the outputs of the filters by themselves and an adder which adds the signals at the outputs of the squaring elements.

3. The test apparatus according to claim 1, wherein the frequency and/or the amplitude and/or the phase of the output signal from the frequency converter is/are set on the basis of the state of a frequency setting channel.

4. The test apparatus according to claim 1, comprising a power measurement unit which contains a squaring element which multiplies the digital test response by itself, an averaging element which receives the result of this multiplication and calculates the average therefrom and a connection from the output of the averaging element to one input of the evaluation/control unit.

5. The test apparatus according to claim 1, wherein the evaluation/control unit is connected by means of an input to a control channel which is used to control the evaluation/control unit.

6. The test apparatus according to claim 1, comprising a multiplicity of frequency converters and a multiplicity of frequency selectors, the frequency converters producing a multiplicity of digital reference signals which differ in terms of their frequencies, wherein at least two frequency selectors are connected to various digital reference signals which differ in terms of their frequency.

7. The test apparatus according to claim 1, wherein an offset compensation section is provided between the output of the AD converter to be tested and the digital test response.

8. The test apparatus according to claim 7, comprising an additional measurement circuit comprising:

a first multiplication element whose input has a digital reference signal applied to it which has the same frequency as the analog test signal and the same amplitude resolution as the AD converter to be tested, and which multiplies the input signal by two, a phase shifter which shifts the output signal from the first multiplication element in the additional measurement circuit through $\pi/2$, a second multiplication element which multiplies the output signal from the first multiplication element by the output signal from the first multiplier in a frequency selector, a third multiplication element which multiplies the output signal from the phase shifter by the output signal from the second multiplier in the frequency selector, an adder which forms the sum from the second multiplication element and the third multiplication element, a subtraction element which deducts the output signal from the adder from the test response, a maximum value ascertainment element which ascertains the maximum value of the output signal from the subtraction element.

9. The test apparatus according to claim 1, wherein the amplitude resolution m of the digital reference signal is greater than the amplitude resolution N of the digital test response.

10. The test apparatus according to claim 1, wherein circuits in the test apparatus are integrated in the chip which contains the AD converter to be tested.

11. The test apparatus according to claim 1, wherein circuits in the test apparatus are integrated in a field programmable gate array.

12. A method for testing analog/digital converter (AD converters) comprising the steps of:

a) producing a digital test signal, b) producing an analog test signal as input signal for the AD converter from the digital test signal, c) producing a sinusoidal, digital reference signal whose frequency is equal to or an integer multiple of the frequency of the analog test signal, d) mixing the test response from the AD converter with the digital reference signal and with a digital reference signal shifted through $\pi/2$ to form mixed signals, e) determining the DC components of the mixed signals, f) determining at least one of the parameters, selected from the group consisting of amplitude, power component and phase angle, for a fundamental or harmonic of the test response from the DC components of the mixed signals.

13. The method according to claim 12, wherein in step f) the phase angle of the fundamental of the test response is determined by shifting the phase of the digital reference signal.

14. The method according to claim 12, wherein in step f) the phase angle of the fundamental of the test response is obtained by ascertaining the inverse tangent of the quotient of the DC components of the mixed signals.

15. The method according to claim 12, wherein in step c) a plurality of digital reference signals at different frequencies are produced, and in step d) a plurality of digital reference signals are simultaneously mixed with the test response.

16. The method according to claim 12, wherein after step f) the step sequence c), d), e) and f) is repeated at least once, with step c) involving a frequency of the digital reference signal being altered.

17. The method according to claim 12, further comprising determining the total power of the test response.

18. The method according to claim 12, wherein in a further step values SNR, SINAD, SNDR and THD for the AD converter are ascertained using the parameters ascertained in step f) and the ascertained total power.

19. The method according to claim 12, wherein before step f) the offset in the test response is compensated for.

20. The method according to claim 12, comprising the following steps:

a1) producing a further digital reference signal which has the same frequency as the analog test signal and the same amplitude resolution as the AD converter to be tested, b1) multiplying the further reference signal by two, c1) multiplying the DC components of the mixed signals from step e) by the cosine or by the sine of the further reference signal multiplied by two, d1) adding the results of the multiplication operations from step c1), e1) subtracting the result of the addition from step e 1), f1) forming the maximum value of the subtraction result, wherein step a1) takes place after step a) and step c1) takes place after step e).

* * * * *

UNITED STATES PATENT AND TRADEMARK OFFICE
CERTIFICATE OF CORRECTION

PATENT NO.         : 7,391,349 B2
APPLICATION NO.    : 11/692554
DATED              : June 24, 2008
INVENTOR(S)        : Claus Dworski et al.

It is certified that error appears in the above-identified patent and that said Letters Patent is hereby corrected as shown below:

In Column 2, Line 45:
　　Please delete "$\Phi_0$" and insert --$\varphi_0$--.

In Column 5, Line 15:
　　Please delete "$\Phi_0$" and insert --$\varphi_0$--.

In Column 5, Line 20:
　　Please delete "$\Phi_0$" and insert --$\varphi_0$--.

In Column 5, Line 34:
　　Please delete "$\Phi_0$" and insert --$\varphi_0$--.

In Column 5, Line 61:
　　Please delete "$\Phi_0$" and insert --$\varphi_0$--.

In Column 5, Line 66:
　　Please delete "$\Phi_i$" and insert --$\varphi_i$--.

In Column 6, Line 20:
　　Please delete "$\Phi_0$" and insert --$\varphi_0$--.

In Column 6, Line 20:
　　Please delete "$\Phi_I$" and insert --$\varphi_I$--.

In Column 7, Line 7:
　　Please delete "$\Phi_0$" and insert --$\varphi_0$--.

In Column 7, Line 11, first occurrence:
　　Please delete "$\Phi_0$" and insert --$\varphi_0$--.

In Column 7, Line 11, second occurrence:
　　Please delete "$\Phi_0$" and insert --$\varphi_0$--.

UNITED STATES PATENT AND TRADEMARK OFFICE
CERTIFICATE OF CORRECTION

PATENT NO.        : 7,391,349 B2
APPLICATION NO.   : 11/692554
DATED             : June 24, 2008
INVENTOR(S)       : Claus Dworski et al.

It is certified that error appears in the above-identified patent and that said Letters Patent is hereby corrected as shown below:

In Column 10, Line 56:
    Please delete "$\Phi_0$" and insert --$\varphi_0$--.

In Column 10, Line 67:
    Please delete "$\Phi_0$" and insert --$\varphi_0$--.

Signed and Sealed this

Twenty-seventh Day of January, 2009

JOHN DOLL
*Acting Director of the United States Patent and Trademark Office*